United States Patent [19]

Sasaki

[11] Patent Number: 5,126,738
[45] Date of Patent: Jun. 30, 1992

[54] CIRCUIT FOR DECODING A SEQUENTIALLY AND SERIALLY INPUTTED, VARIABLE LENGTH CODE

[75] Inventor: Mikio Sasaki, Hamamatsu, Japan

[73] Assignee: Yamaha Corporation, Hamamatsu, Japan

[21] Appl. No.: 600,315

[22] Filed: Oct. 19, 1990

[30] Foreign Application Priority Data

Oct. 27, 1989 [JP] Japan ................................ 1-281189

[51] Int. Cl.⁵ .................................................. H03M 7/40
[52] U.S. Cl. ........................................... 311/67; 341/79
[58] Field of Search ...................... 341/65, 67, 79, 106

[56] References Cited

U.S. PATENT DOCUMENTS

| | | | |
|---|---|---|---|
| 4,312,018 | 1/1982 | Nakajiri | 341/65 |
| 4,475,174 | 10/1984 | Kanayama | 341/67 |
| 4,591,829 | 5/1986 | Takeda | 341/65 |
| 4,647,908 | 3/1987 | Ross et al. | 341/67 |
| 4,853,696 | 8/1989 | Mukherjee | 341/65 |
| 4,899,149 | 2/1990 | Kahan | 341/67 |
| 4,967,196 | 10/1990 | Sprague et al. | 341/67 |

OTHER PUBLICATIONS

"A Note on the Representation of Code Table for Huffman Coding", *The Transactions of Institute of Electronic*, Information and Communication Engineers of Japan, vol. J70-A, No. 10, pp. 1501-1503, Oct. 1987, S. Handa, et al.
"Decoding Automata of Huffman Codes by Data Structure", *The Transactions of Institute of Electronics and Communications Engineers of Japan*, vol. J61-A, No. 11, Nov. 1978, H. Tanaka, et al.
"A Huffman-Type Code Generator with Order-N Complexity", *IEEE Transactions on Acoustics, Speech, and Signal Processing*, vol. 38, No. 9,. Sep. 1990, Ming-I Lu, et al.
"An Encoding Procedure and a Decoding Procedure for a New Modified Huffman Code", *IEEE Transactions on Acoustics, Speech, and Signal Processing*, vol. 38, No. 1, Jan. 1990, Ming-I Lu, et al.

*Primary Examiner*—A. D. Pellinen
*Assistant Examiner*—Marc S. Hoff
*Attorney, Agent, or Firm*—Spenseley, Horn, Jubas & Lubitz

[57] ABSTRACT

A variable length code decoding circuit is provided for detecting a variable length code from a code string which is sequentially and serially inputted, and outputting a signal value of the detected variable length code. The circuit includes a memory for storing state variables which have fixed length and a state controller for controlling the state variables corresponding to the inputted information and the stored state variable which represents former inputted information, and for outputting the decoded variable length code when the state variable indicates the completion of decoding of the variable length code. Because the circuit handles state variable which have a fixed length code instead of the variable length code during the judging procedure, complicated calculation is prevented and memory reduction is realized.

5 Claims, 7 Drawing Sheets

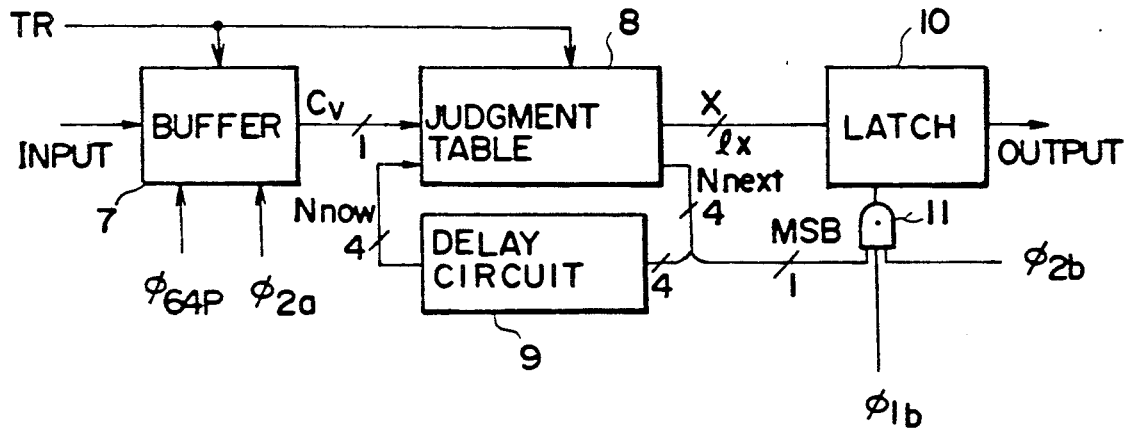
F I G. 1
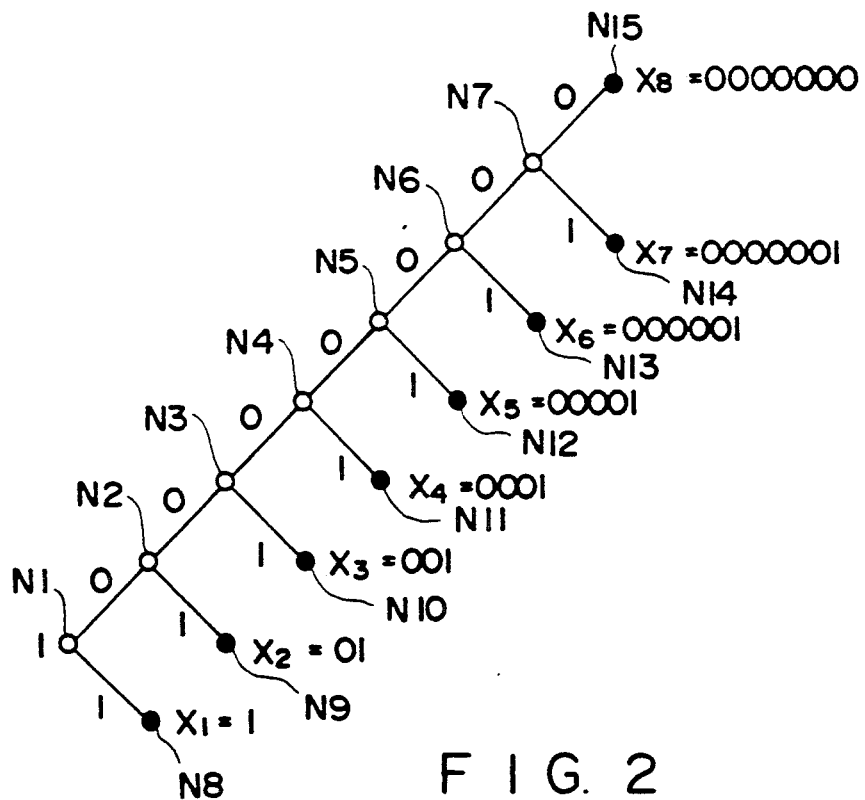
F I G. 2

| N now | | Cv | N next | | X |
|---|---|---|---|---|---|
| BINARY EXPRESSION | DECIMAL EXPRESSION | | BINARY EXPRESSION | DECIMAL EXPRESSION | |
| 0 0 0 1 | 1 | 0 | 0 0 1 0 | 2 | — |
| | | 1 | 1 0 0 0 | 8 | $X_1$ |
| 0 0 1 0 | 2 | 0 | 0 0 1 1 | 3 | — |
| | | 1 | 1 0 0 1 | 9 | $X_2$ |
| 0 0 1 1 | 3 | 0 | 0 1 0 0 | 4 | — |
| | | 1 | 1 0 1 0 | 10 | $X_3$ |
| 0 1 0 0 | 4 | 0 | 0 1 0 1 | 5 | — |
| | | 1 | 1 0 1 1 | 11 | $X_4$ |
| 0 1 0 1 | 5 | 0 | 0 1 1 0 | 6 | — |
| | | 1 | 1 1 0 0 | 12 | $X_5$ |
| 0 1 1 0 | 6 | 0 | 0 1 1 1 | 7 | — |
| | | 1 | 1 1 0 1 | 13 | $X_6$ |
| 0 1 1 1 | 7 | 0 | 1 1 1 1 | 15 | $X_7$ |
| | | 1 | 1 1 1 0 | 14 | $X_8$ |

↓ ↓ ↓  ↓  ↓ ↓ ↓ ↓  ↑
$A_3$ $A_2$ $A_1$   $A_0$   $Q\ell x+2$   $Q\ell x$   $Q_0 \sim Q\ell x-1$
        $Q\ell x+3$ $Q\ell x+1$

F I G. 3

| N now | | Cv | Nnext | | X |
|---|---|---|---|---|---|
| BINARY EXPRESSION | DECIMAL EXPRESSION | | BINARY EXPRESSION | DECIMAL EXPRESSION | |
| 1 0 0 0 | 8 | 1 | 1 0 0 1 | 9 | — |
| | | 0 | 1 0 1 1 | 11 | — |
| 1 0 0 1 | 9 | 1 | 0 0 0 0 | 0 | $X_1$ |
| | | 0 | 1 0 1 0 | 10 | — |
| 1 0 1 0 | 10 | 1 | 0 0 0 1 | 1 | $X_2$ |
| | | 0 | 0 0 1 0 | 2 | $X_3$ |
| 1 0 1 1 | 11 | 1 | 1 1 0 0 | 12 | — |
| | | 0 | 1 1 0 1 | 13 | — |
| 1 1 0 0 | 12 | 1 | 0 0 1 1 | 3 | $X_4$ |
| | | 0 | 0 1 0 0 | 4 | $X_5$ |
| 1 1 0 1 | 13 | 1 | 0 1 0 1 | 5 | $X_6$ |
| | | 0 | 1 1 1 0 | 14 | — |
| 1 1 1 0 | 14 | 1 | 0 1 1 0 | 6 | $X_7$ |
| | | 0 | 0 1 1 1 | 7 | $X_8$ |

F I G. 8

CIRCUIT FOR DECODING A SEQUENTIALLY AND SERIALLY INPUTTED, VARIABLE LENGTH CODE

BACKGROUND OF THE INVENTION

1. Field of the Invention

The present invention relates to a variable length code (e.g., a Huffman code) decoding circuit.

2. Prior Art

When signal values of speech signals at respective sampling timings or signal values of dots (picture elements) of image signals are taken into consideration, a frequency of appearance of the signal values is not uniform. That is, some signals appear frequently, but some other signals do not appear so frequently. In recording or transmission of speech signals, image signals or the like, a variable length code such as a Huffman code is used as a code for representing each signal value. In this case, a variable length code having a small code length is assigned to a signal value which has a high frequency of appearance to compress data to be transmitted or recorded.

In order to decode a variable length code, it may be considered, for example, that the code patterns of variable length codes are prestored and when a code is inputted bit by bit, a code string comprising the bit or bits inputted up to that time is compared with each of the prestored code patterns, and this operation is repeated every time one bit is inputted. However, when such decoding processing is realized by software processing of a computer, a computation volume per input code is very large, and it is difficult to execute real-time decoding processing which follows an input bit rate of a code string. In addition, no simple apparatus for decoding a variable length code is available.

SUMMARY OF THE INVENTION

The present invention has been made in consideration of the above situation, and has as its object to provide a variable length code decoding circuit, which can be realized by a simple and compact arrangement.

In order to achieve the above object, according to the present invention, there is provided a variable length code decoding circuit for detecting a variable length code from a code string which is sequentially and serially inputted, and outputting a signal value of the detected variable length code, comprising:

a storage means for storing a state variable corresponding to a code string which is inputted up to the time and has not been decoded yet; and a state control means for generating a state variable corresponding to both a new input code and the state variable stored in the storage means, and for, when the generated state corresponds to a decoding completion state of any variable length code, outputting a signal value of the completed variable length code.

According to the above arrangement, every time each code constituting a variable length code is inputted, a state variable is updated based on an already inputted code string at the time and a new input code, and when the state variable reaches a value corresponding to a decoding completion state of any variable length code, a signal value corresponding to the variable length code is outputted.

BRIEF DESCRIPTION OF THE DRAWINGS

FIG. 1 is a circuit diagram showing an arrangement of a variable length code decoding circuit according to an embodiment of the present invention;

FIG. 2 shows an encoding (decoding) binary tree corresponding to a state transition in the embodiment shown in FIG. 1;

FIG. 3 shows a content of a judgment table stored in a ROM 8 in the embodiment shown in FIG. 1;

FIG. 8 shows a judgment table for controlling a write state of the ROM 8 shown in FIG. 1 when a decoding circuit for the variable length code shown in FIG. 6 is to be realized;

DETAILED DESCRIPTION OF THE PREFERRED EMBODIMENTS

An embodiment of the present invention will be described below with reference to the accompanying drawings.

Encoding Circuit

Figures 9, 10:
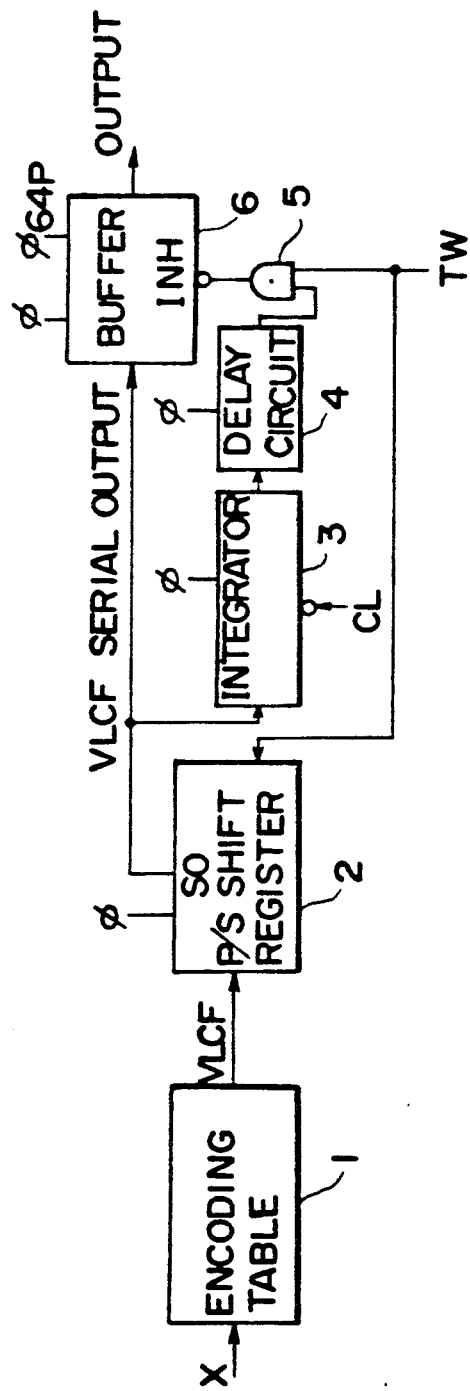
FIG. 9 is a circuit diagram showing an arrangement of an encoding circuit for converting a fixed length code into a variable length code.
FIG. 10 shows a variable length code VLC and intermediate data VLCF processed by the encoding circuit shown in FIG. 9.

Prior to a description of a variable length code decoding circuit, an encoding circuit for converting a fixed length code into a variable length code will be described below. FIG. 9 shows an arrangement of the encoding circuit. In FIG. 9, reference numeral 1 denotes a ROM (read-only memory); 2, a parallel input/serial output type shift register; 3, a 1-bit integrator; 4, a 1-clock delay circuit; 5, and AND gate; and 6, a FIFO (first-in first-out) buffer.

Any of eight different signal values $X_1$ to $X_8$ is inputted to the encoding circuit as an input signal X, and is converted into a corresponding variable length code VLC. The input signal X is not directly converted to the variable length code VLC but is temporarily converted to fixed length intermediate data VLCF including a code string corresponding to the variable length code VLC, and then the variable length code VLC included in the intermediate data VLCF is extracted.

FIG. 10 shows variable length codes VLC and intermediate data VLCF corresponding to the signal values $X_1$ to $X_8$, respectively. As shown in FIG. 10, in the variable length codes corresponding to the signal values $X_1$ to $X_8$, the numbers of continuous "0"s are respectively "0" to "7", and the LSBs of the variable length codes corresponding to the signal values $X_1$ to $X_7$ are "1".

Each intermediate data VLCF is formed in such a manner that a code "1" is added as the MSB of a variable length code VLC, and a necessary number of codes "0" are filled at the upper-bit side to attain an 8-bit code length as a whole. The ROM 1 shown in FIG. 9 stores a code table for converting the signal values $X_1$ to $X_8$ into the corresponding intermediate data VLCF.

Figure 11:
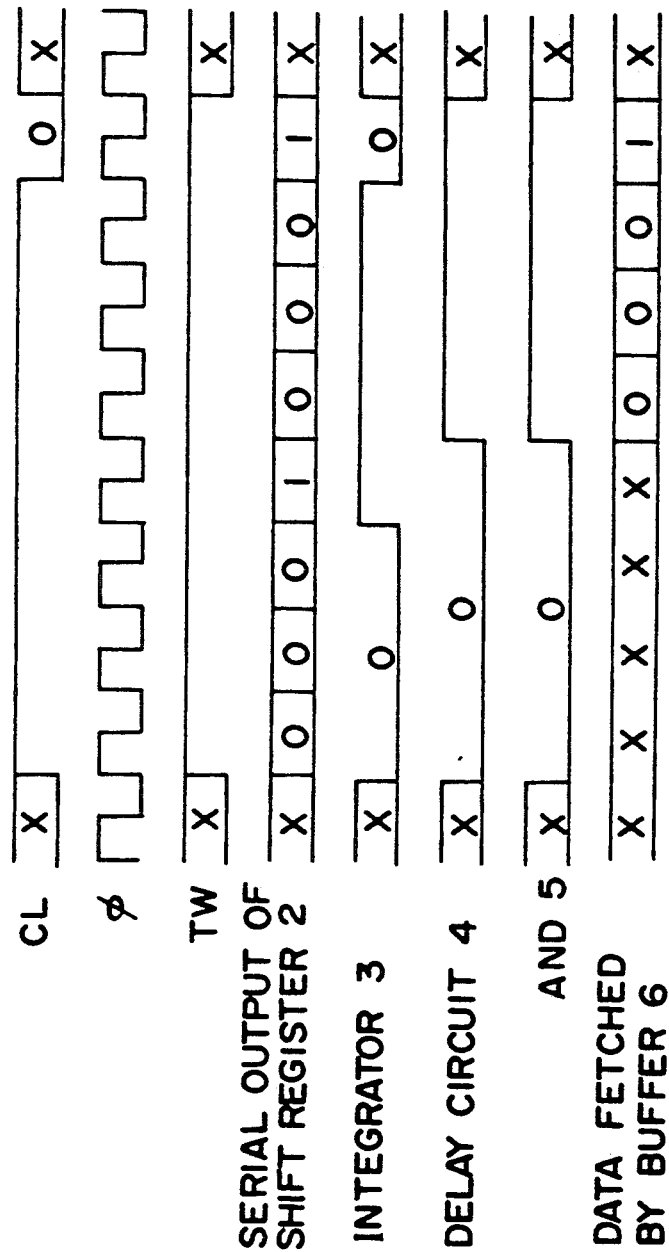
FIG. 11 is a timing chart showing an operation of the encoding circuit shown in FIG. 9.

The operation of the encoding circuit will be described below with reference to the timing chart shown in FIG. 11. The input signal X is supplied to the ROM 1 as an address, intermediate data VLCF corresponding to the signal value of the input signal X is outputted, and is parallelly loaded in the shift register 2 in synchronism with a clock $\phi$. Thereafter, a write signal TW goes to "1", and the shift register 2 switched to a serial mode. Thus, the intermediate data VLCF is outputted bit by bit from its MSB in synchronism with the clock $\phi$, and the outputted bits are supplied to the data input terminal of the buffer 6. FIG. 11 exemplifies a case wherein the signal value $X_4$ is inputted as the input signal X.

The integrator 3 sequentially fetches the serial outputs of the shift register 2 in synchronism with the clock $\phi$. When the integrator 3 fetches a code "1", its integral value goes to "1". When a code "1" at the fourth bit from the MSB side in the intermediate data VLCF, i.e., a code "1" added to the upper bit portion of the code string corresponding to the variable length code VLC is output from the shift register 2, the output from the integrator 3 goes to "1". Note that the integrator 3 is cleared at the input timing of the LSB. The output from the integrator 4 is delayed by one clock period by the delay circuit 4, and the delayed output is inputted to the AND gate 5. So, during only a period in which the variable length code VLC is outputted from the shift register 2, the output from the AND gate 5 goes to "1" to cancel a clock inhibit mode of the buffer 6, and the variable length code 6 is fetched by the buffer 6 bit by bit in synchronism with the clock $\phi$. The variable length code VLC fetched by the buffer 6 is supplied to transmission system in synchronism with a clock $\phi_{64p}$ supplied from the transmission system.

Decoding Circuit

FIG. 1 shows a variable length code decoding circuit according to an embodiment of the present invention. This decoding circuit decodes the variable length code VLC shown in FIG. 10, and comprises a buffer 7, a ROM 8, a delay circuit 9, a latch 10 for latching a signal value X as a result of decoding, and an AND gate 11.

The ROM stores a decoding processing state control judgment table. State control of decoding processing in this decoding circuit will be described below with reference to an encoding (decoding) binary tree shown in FIG. 2. In FIG. 2, nodes N1 to N7 indicated by marks "0" correspond to states wherein signal values ($X_1$ to $X_8$) corresponding to variable length codes are not determined yet, and an input of code bits is required, and nodes N8 to N15 indicated by marks "●" represent states wherein an input of all the bits of the variable length codes is completed, and the signal values ($X_1$ to $X_8$) are determined. A code "0"/"1" attached to a branch connecting the nodes represents a condition for generating a state transition corresponding to the branch. More specifically, the condition code means that when a new code is inputted, the state control transits for a node connected to a branch having the same code value as that of the new code.

For example, a case will be described below wherein a variable length code "0001" corresponding to the signal value $X_4$ is inputted. Upon completion of the input of the LSB of the immediately preceding variable length code, a state is initialized to the node N1. When the first bit "0" of the variable length code to be decoded is inputted, the control advances to the node N2; when the second bit "0" is inputted, the control advances to the node N3; and when the third bit "0" is inputted, the control advances to the node N4. When the LSB "1" is inputted, the control advances to the node N11, and the signal value $X_4$ is determined. In this manner, every time each code bit constituting the variable length code is inputted, a state transition destination is determined in correspondence with the input code value and the state of the decoding circuit at that timing, thus continuing the decoding processing.

FIG. 3 shows the content of the state control judgment table stored in the ROM 8. In FIG. 3, reference symbol $N_{now}$ denotes a node number at the present timing; $C_v$, a code value of a new input code at the present timing; and $N_{next}$, a node number at the transition destination. More specifically, this judgment table shows transition destination numbers $N_{next}$ corresponding to new input code values $C_v$ in units of the nodes N1 to N7 of the encoding (decoding) binary tree shown in FIG. 2.

The ROM 8 receives a new code $C_v$ supplied through the buffer 7 as an address $A_0$, and also receives lower 3 bits of a 4-bit node number $N_{now}$ stored in the delay circuit as addresses $A_1$ to $A_3$. A storage area addressed by the lower 3 bits of the node number $N_{now}$ and the new code value $C_v$ is looked up. Thus, the next transition destination node number $N_{next}$ according to the judgment table is read out, and is output from $Q_{lx}$ to $Q_{lx+3}$ of the ROM 8. The readout node number $N_{next}$ is fetched by the delay circuit 9 in synchronism with a supply timing of the next new code from the buffer 7, and the delayed number is supplied to the ROM 8 as the node number $N_{now}$. Thereafter, transition destination node numbers $N_{next}$ are similarly determined according to the new code values $C_v$ and the node numbers $N_{now}$. Upon completion of decoding, a signal value X (code length lx) corresponding to the variable length code is output from the $Q_0$ to $Q_{lx-1}$ outputs of the ROM 8.

Figure 4:
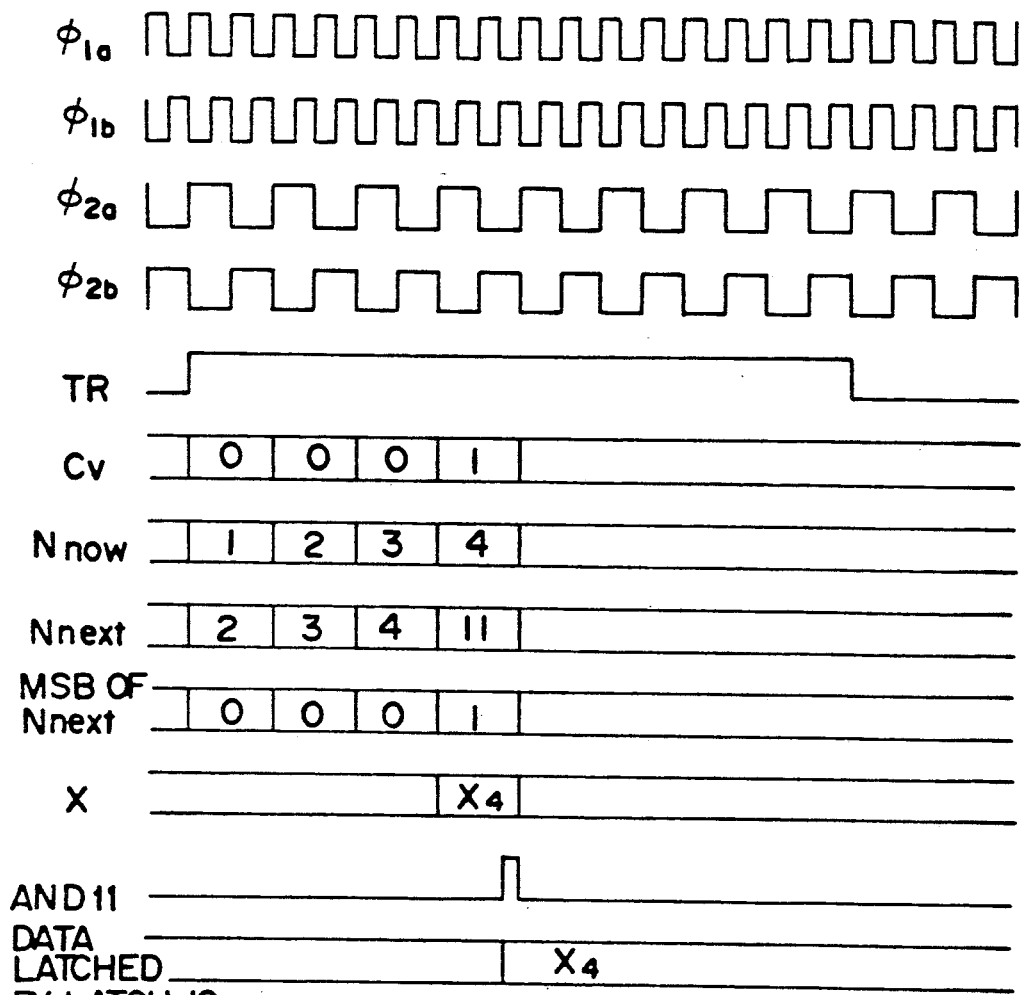
FIG. 4 is a timing chart for explaining the operation of the embodiment shown in FIG. 1.

The operation of this decoding circuit will be described below with reference to the timing chart of FIG. 4. FIG. 4 exemplifies a case wherein a variable length code corresponding to the signal value $X_4$ is decoded. As shown in FIG. 4, the respective sections of the decoding circuit are driven in synchronism with two-phase clocks $\phi_{1a}$ and $\phi_{1b}$ and two-phase clocks $\phi_{2a}$ and $\phi_{2b}$ synchronous with the former two-phase clocks and having periods twice those of the former clocks.

The variable length code VLC is serially written in the buffer 7 bit by bit in synchronism with the clock $\phi_{64p}$ generated by the transmission system. When the variable length code stored in the buffer 7 is to be decoded, an enable signal TR is switched to "1". As a result, a read operation of the buffer 7 is enabled, and bit data "0", "0", "0", and "1" constituting the variable length code VLC are sequentially read out from the MSB in synchronism with the clock $\phi_{2a}$, and are sequentially supplied to the ROM 8 as the new code $C_v$.

Prior to supply of the variable length code VLC to the ROM 8, the delay circuit 9 is initialized to a state wherein it stores "1" as the node number $N_{now}$. Therefore, when the first bit "0" of the variable length code is supplied to the ROM 8 as an address $A_0$, "2" is outputted as the node number $N_{next}$, as can be seen from the judgment table shown in FIG. 3. Then, the second bit "0" is supplied from the buffer 7 to the ROM 8 in synchronism with the clock $\phi_{2a}$, and the node number "2" output from the ROM 8 is fetched by the delay circuit 9 as the node number $N_{now}$ at the present timing. As a result, "3" is outputted from the ROM 8 as the node number $N_{next}$. The same operation as described above is executed when the third bit "0" is supplied to the ROM 8, so that the node number $N_{now}$ is updated to "3", and the node number $N_{next}$ is updated to "4".

In this manner, when the fourth bit, i.e., the LSB "1" is inputted in a state wherein the node number $N_{now}$ becomes "3", "11" is outputted as the node number $N_{next}$. The node number "11" is a number representing a state wherein decoding of the variable length code corresponding to the signal value $X_4$ is completed. Simultaneously with the output of the node number "11", the signal value $X_4$ is outputted from the $Q_0$ to $Q_{lx-1}$ outputs of the ROM 8 as an lx-bit fixed length code, and is supplied to the latch 10. Since the node number $N_{next}$ is "11" and the MSB in its binary expression is "1", the AND gate 11 is enabled. Since both the clocks $\phi_{1b}$ and $\phi_{2b}$ go to "1", the signal value $X_4$ is latched by the latch 10, and is then outputted.

In the decoding circuit described above, a storage capacity required to the ROM 8 to store the judgement table is given by equation (1):

$$M = 2^{NT} \cdot (NT + lx)[bit] \quad (1)$$

where lx is the number of bits of a signal value corresponding to the variable length code, and NT is given by equation (2):

$$NT = integer\{ \log_2 (N_c - 1) \} + 2 \quad (2)$$

where $N_c$ is the number of code words of the variable length code. In this embodiment, the ROM 8 has a small storage capacity.

Modification 1

Figure 5:
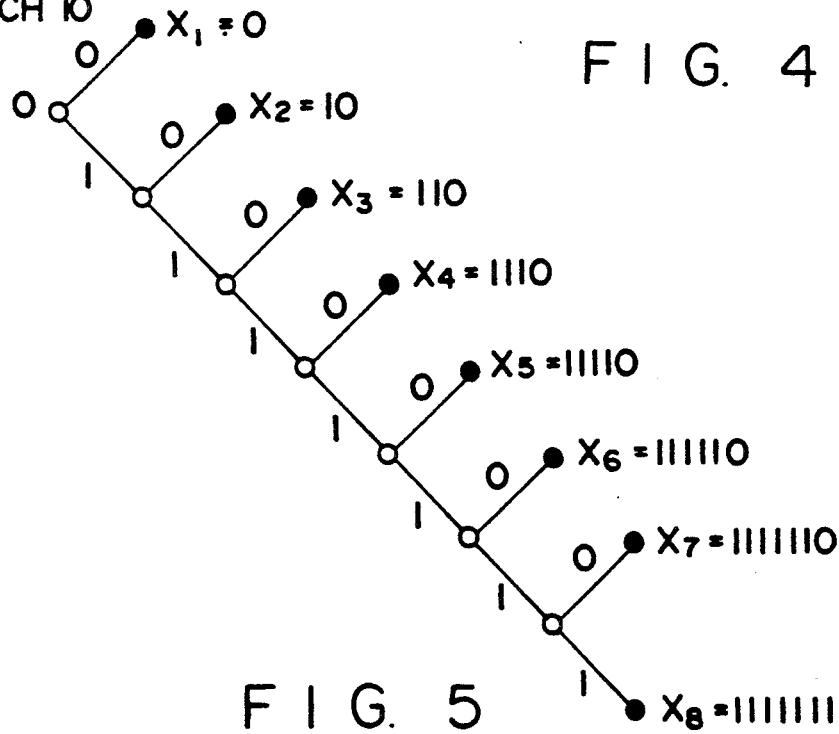
FIG. 5 shows an encoding (decoding) binary tree of a variable length code which can be decoded by the same arrangement as that of the embodiment shown in FIG. 1.

In the embodiment described above, the case has been exemplified wherein a variable length code in which the number of continuous "0"s is changed according to a signal value, as shown in FIG. 10, is to be decoded. With the same arrangement, a variable length code in which the number of continuous "1"s is changed according to a signal value may be decoded by rewriting the content of the judgment table stored in the ROM 8 in correspondence with an encoding (decoding) binary tree shown in FIG. 5.

Modification 2

Figures 6, 7:
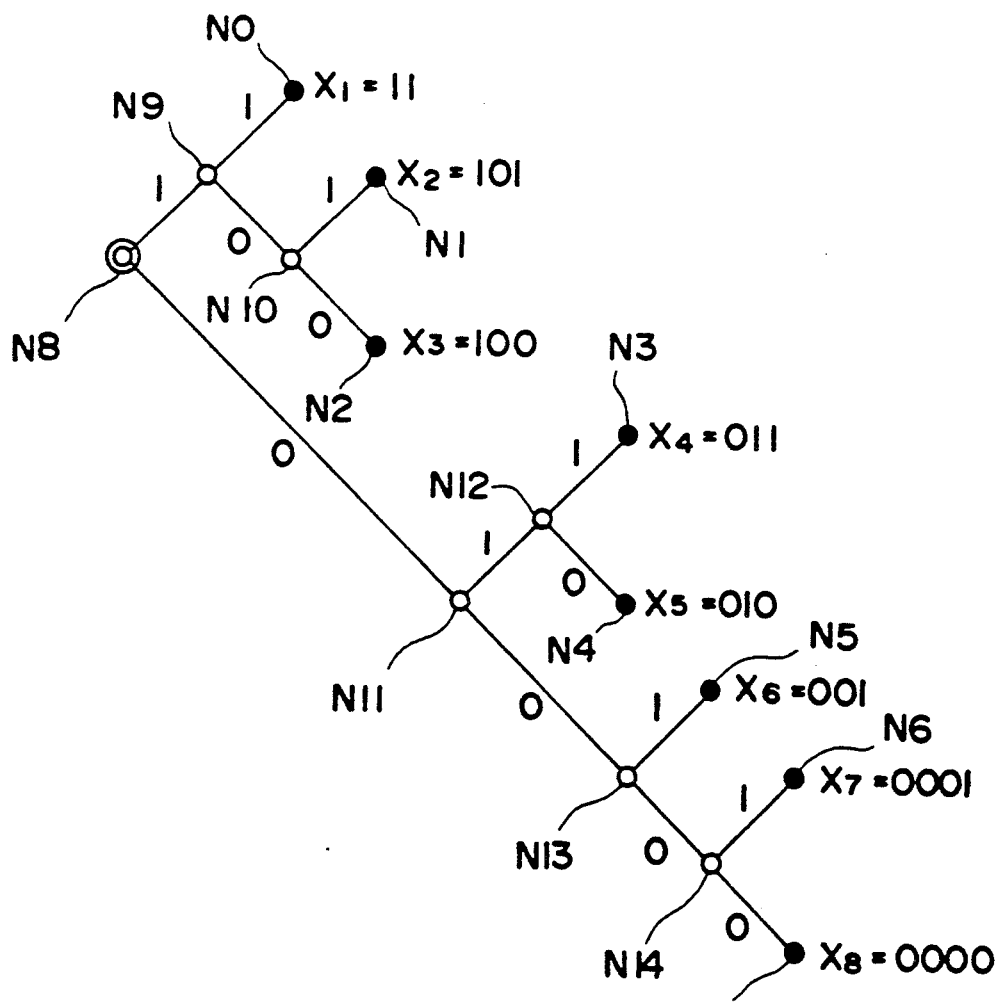
FIG. 6 shows another variable length code to which the present invention can be applied.
FIG. 7 shows an encoding (decoding) binary tree of the variable length code shown in FIG. 6.

The present invention is not limited to a variable length code whose LSB is fixed to "0" or "1", but may be applied to decoding of various other variable length codes which are encoded by various methods. For example, for a complex variable length code VLC shown in FIG. 6, a decoding circuit can be easily designed. First, an encoding (decoding) binary tree for variable length codes VLC is created. In this case, a tree shown in FIG. 7 is obtained. A state control judgment table shown in FIG. 8 is created on the basis of the encoding (decoding) binary tree shown in FIG. 7. The created judgment table is written in a PROM or the like to complete the ROM 8. An encoding circuit in this case can be realized in such a manner that the content to be written in the ROM 1 shown in FIG. 9 is rewritten with the table shown in FIG. 6, and a timing control system is modified so that a period in which the write signal TW becomes "1" corresponds to five periods of the clock $\phi$.

As described above, the decoding circuit of the according to the present invention comprises a storage means for storing a state variable corresponding to a code string which is inputted up to a present timing and is not decoded, and a state control means for generating a state variable corresponding to a new input code and the state variable stored in the storage means, and for, when the generated state corresponds to a decoding completion state of any variable length code, outputting a signal value of the variable length code. Therefore, the variable length code decoding circuit can be realized by a simple and compact circuit arrangement.

What is claimed is:

1. A variable length code decoding circuit for detecting a variable length code from a code string which is sequentially and serially inputted, and outputting a signal value of the detected variable length code, comprising:

storage means for storing a state variable corresponding to a code string which is inputted up to a predetermined time and has not been decoded yet, said state variable changing corresponding to an inputted code; and state control means for generating a state variable in accordance with a new input code and the state variable stored in said storage means by assigning a state of transition based on a predetermined combination of the stored state variable and the new input code, and for, when the generated state variable corresponds to a decoding completion state of any variable length code, outputting a signal value corresponding to the decoding completion of the variable length code.

2. A variable length code decoding circuit according to claim 1 wherein said storage means stores a different state variable corresponding to a different inputted code following a present state variable, one of said state variables being indicative of decoding completion.

3. A code decoding circuit for decoding a variable length code from a code string which is sequentially and serially inputted, and outputting a signal value of the detected variable length code, comprising:

storage means for storing a predetermined length code indicative of a state variable, a predetermined portion of said code being information which is related to completion of decoding of said code;

state control means for generating a state variable in accordance with a new input code and the state variable stored in said storage means by assigning a state of transition based on a predetermined combination of the stored state variable and the new input code;

detecting means for detecting whether the state variable represents completion of decoding of said code; and output means for outputting the variable length code corresponding to said state variable in response to said detecting means.

4. A code decoding circuit according to claim 3 wherein said predetermined length code is a fixed length code.

5. A code decoding circuit according to claim 3 wherein said detecting means detects the completion of decoding from the most significant bits of the state variable.

* * * * *